(12) United States Patent
Mori

(10) Patent No.: US 8,970,259 B2
(45) Date of Patent: Mar. 3, 2015

(54) POWER TRANSISTOR DRIVE CIRCUIT

(71) Applicant: Fuji Electric Co., Ltd., Kawasaki-shi (JP)

(72) Inventor: Takahiro Mori, Matsumoto (JP)

(73) Assignee: Fuji Electric Co., Ltd. (JP)

(*) Notice: Subject to any disclaimer, the term of this patent is extended or adjusted under 35 U.S.C. 154(b) by 13 days.

(21) Appl. No.: 13/859,861

(22) Filed: Apr. 10, 2013

(65) Prior Publication Data
US 2013/0285732 A1 Oct. 31, 2013

(30) Foreign Application Priority Data

Apr. 10, 2012 (JP) .................................. 2012-089761

(51) Int. Cl.
| H03B 1/00 | (2006.01) |
| G05F 1/10 | (2006.01) |
| H03K 17/14 | (2006.01) |

(52) U.S. Cl.
CPC .................................... *H03K 17/145* (2013.01)
USPC ........................................... 327/108; 327/538

(58) Field of Classification Search
None
See application file for complete search history.

(56) References Cited

U.S. PATENT DOCUMENTS

| 5,980,106 A * | 11/1999 | Yamamoto et al. ............ 374/178 |
| 8,350,601 B2 * | 1/2013 | Nagata et al. .................. 327/109 |
| 8,618,845 B2 * | 12/2013 | Hokabira et al. .............. 327/109 |
| 2002/0057125 A1 * | 5/2002 | Demizu ......................... 327/538 |
| 2008/0094111 A1 | 4/2008 | Nakamori et al. |
| 2008/0309608 A1 * | 12/2008 | Shen et al. ..................... 345/101 |
| 2012/0217937 A1 * | 8/2012 | Miyauchi et al. .............. 322/28 |
| 2012/0242376 A1 * | 9/2012 | Ose et al. ....................... 327/109 |
| 2013/0214823 A1 * | 8/2013 | Kawamoto et al. ........... 327/109 |

FOREIGN PATENT DOCUMENTS

| JP | 2003-124796 A | 4/2003 |
| JP | 2008-103895 A | 5/2008 |

* cited by examiner

*Primary Examiner* — Tuan T Lam
(74) *Attorney, Agent, or Firm* — Rossi, Kimms & McDowell LLP

(57) ABSTRACT

Aspects of the invention include a constant current source that generates a constant current, apart from a constant current circuit, and a temperature detection zener diode (a temperature detection element). The input side of the constant current source can be connected to a power source. The output side of the constant current source can be connected to the anode of the temperature detection diode. The anode of the temperature detection zener diode can also be connected to one end of a resistor provided in the constant current circuit. Further, the cathode of the temperature detection zener diode can be connected to a GND. Further, the temperature detection zener diode can be incorporated in the same semiconductor substrate as a semiconductor substrate into which an IGBT is built.

5 Claims, 5 Drawing Sheets a : HERETOFORE KNOWN TURN-ON CONSTANT
    CURRENT CHARACTERISTICS
b : CURRENT-TEMPERATURE CHARACTERISTICS OF THE INVENTION
c : IGBT TURN-ON TIME - TEMPERATURE CHARACTERISTICS

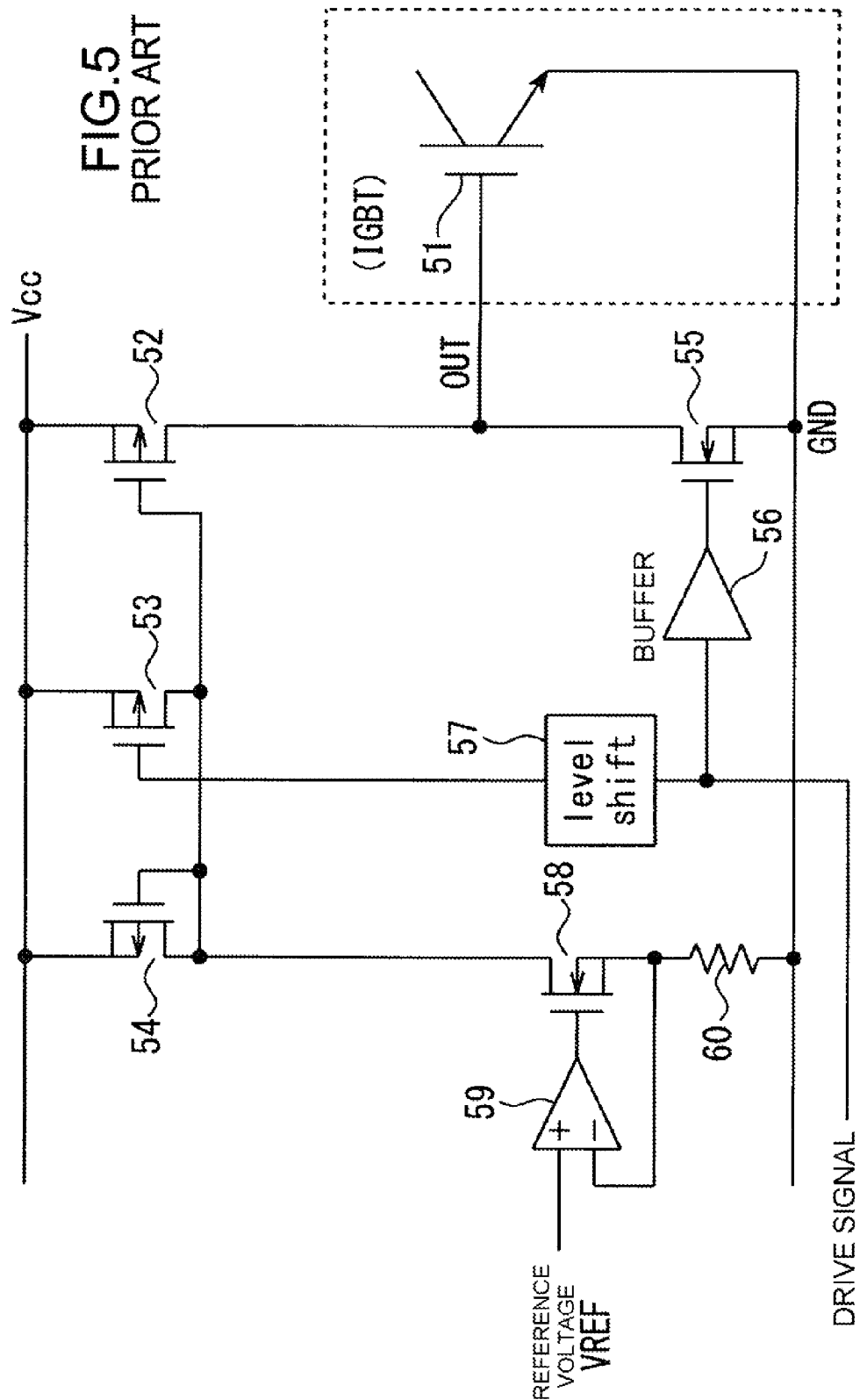

POWER TRANSISTOR DRIVE CIRCUIT

BACKGROUND OF THE INVENTION

1. Technical Field

Embodiments of the invention relate to power transistor drive circuits, and, in particular, to power transistor drive circuits that drive power transistors in accordance with certain temperature-current characteristics when the power transistor is turned on.

2. Related Art

A gated power device such as an insulated gate bipolar transistor (IGBT) or a power MOSFET is used in a semiconductor power converter, and there is a method of configuring a drive circuit for driving the power device as an inverter. Problems occurring when driving are the generation of loss and noise and the temperature characteristics when turning on.

In FIG. 5, a p-channel field effect transistor (P-FET) 52 and an n-channel field effect transistor (N-FET) 55 are connected in series to each other. The source of the P-FET 52 is connected to a power source voltage Vcc, and the drain of the P-FET 52 is connected to the drain of the N-FET 55. The source of the N-FET 55 is connected to a GND.

The source of a P-FET 54 is connected to the power source voltage Vcc, and the gate of the P-FET 54 is connected to the drain of the P-FET 54.

The P-FET 52 forms a current mirror circuit with the P-FET 54. An N-FET 58 and resistor 60 connected to the drain of the P-FET 54 are connected in series to each other, and one end of the resistor 60 is connected to the GND.

The output of an operational amplifier 59 is connected to the gate of the N-FET 58, the inverting input terminal of the operational amplifier 59 is connected to the source of the N-FET 58, and a reference voltage VREF set inside a drive circuit is input into the non-inverting input terminal of the operational amplifier 59.

The source of a P-FET 53 is connected to the Vcc, the drain of the P-FET 53 is connected to the drains of the P-FETs 52 and 54, and the gate of the P-FET 53 is connected to the output of a level shift circuit 57. A drive signal is input into the input of the level shift circuit 57 and a buffer 56. The level shift circuit 57 is used to regulate the voltage of the P-FET 53. An output from the buffer 56 is input into the gate of the N-FET 55, and the N-FET 55 is turned on, as a result of which the gate of an IGBT 51 is connected to the GND.

With respect to this configuration, for example, Japanese Patent Application JP-A-2008-103895 describes an advantage wherein it is possible to turn on the IGBT 51 while amplifying a constant current set by a resistance value in the drive circuit and the reference voltage, because of which it is possible, when turning on, to suppress noise and loss at a room temperature, as well as suppressing noise and loss when the temperature is high.

Also, Japanese Patent Application JP-A-2003-124796 describes a temperature compensation circuit such that a change in complementary output does not become imbalanced by utilizing a current having positive temperature characteristics and a current having negative temperature characteristics.

Further, when a constant current on the primary side of the current mirror in FIG. 5 is taken to be Io, and the resistance value of the resistor 60 is taken to be Rref, the current Io can be found from the relationship between the two, using the following expression (1).

$$Io = VREF/Rref \quad (1)$$

Normally, in an intelligent power module (IPM), a power device such as the IGBT 51 and the drive circuit are mounted on the same module, and the operating temperature of the power module becomes high (in the order of about 150° C.). As a result, in the drive circuit in the vicinity of the power module, the temperature of the drive circuit also rises when the temperature of the power module is high, and the operating resistances of field effect transistors increase.

A decrease in turn-on drive capability when the temperature is high should have therefore been taken into consideration, as described in Japanese Patent Application JP-A-2008-103895. In recent years, however, there has been a wide range of use of the IPM, and there has been a need to take into account a low environmental temperature (about −20° C.) too, but there exists no power transistor drive circuit designed with that much thought.

Particularly with the heretofore known circuit shown in FIG. 5, the effect of suppressing noise and loss can be hoped for owing to an improvement in turn-on drive capability when the temperature of the power module is high, but as the operating resistances of the FETs and IGBT decrease conversely when the temperature is low, there is a problem in that noise and loss increases.

Japanese Patent Application JP-A-2003-124796 is an invention relating to an improvement in turn-on drive capability regardless of the temperature, and does not describe that noise and loss are suppressed.

Thus, as is described above, there are certain shortcomings in the art of power transistor drive circuits.

SUMMARY OF THE INVENTION

Embodiments of the invention address these and other shortcomings. Some embodiments provide a power transistor drive circuit such that it is possible to reduce the temperature dependence of noise and loss when turning on at any temperature from a low temperature to a high temperature.

A power transistor drive circuit according to a first aspect of the invention includes a constant current generation unit, having a first transistor, a second transistor, a third transistor, and a constant current resistor, that supplies a current to a power transistor; a constant current source that generates a constant current, apart from the constant current generation unit; and a temperature detection element, provided integrally in a semiconductor substrate in which is provided the power transistor, that generates a voltage in accordance with temperature, based on the constant current output from the constant current source. One end of the constant current resistor is connected to a first reference potential, while the other end is connected to the source of the first transistor, the drain of the first transistor is connected to the drain of the second transistor, the source of the second transistor is connected to a second reference potential, and the third transistor, of which the drain is connected to the gate, configures a current mirror with the first transistor, while the source of the third transistor is connected to the second reference potential. The drive circuit further includes a control circuit that, based on the voltage in accordance with temperature generated by the temperature detection element, controls a current flowing through the first transistor and constant current resistor.

In a second aspect of the invention, the power transistor drive circuit according to the first aspect is arranged in such a way that the temperature detection element is a diode.

Also, in a third aspect of the invention, the power transistor drive circuit according to the first aspect is arranged in such a way that the lower the temperature of the power transistor, the further the control circuit reduces the value of current flowing through the constant current resistor of the constant current generation unit.

Further, in a fourth aspect of the invention, the power transistor drive circuit according to the first aspect is arranged in such a way that the control circuit controls the gate voltage of the first transistor based on the voltage in accordance with temperature generated by the temperature detection element and on a reference voltage.

Furthermore, in a fifth aspect of the invention, the power transistor drive circuit according to the first aspect is arranged in such a way that the constant current resistor is configured including a plurality of resistors, the voltage in accordance with temperature has negative temperature characteristics, and the control circuit is such that when the voltage in accordance with temperature is high, the number of resistors, of the resistors, connected in series between the first transistor and first reference potential is increased as compared with when the voltage is low.

Furthermore, in a sixth aspect of the invention, the power transistor drive circuit according to the first aspect is arranged in such a way that the constant current resistor is configured including a first resistor, a second resistor, and a third resistor, the voltage in accordance with temperature has negative temperature characteristics, and when ranges of the voltage in accordance with temperature corresponding to a high temperature, a normal temperature, and a low temperature are taken to be a first voltage range, a second voltage range, and a third voltage range respectively, the control circuit is such that, when the voltage in accordance with temperature is in the first voltage range, one of the first to third resistors is connected in series between the first transistor and first reference potential, when the voltage in accordance with temperature is in the second voltage range, two of the first to third resistors are connected in series between the first transistor and first reference potential, and when the voltage in accordance with temperature is in the third voltage range, all of the first to third resistors are connected in series between the first transistor and first reference potential.

Further, in a seventh aspect of the invention, the power transistor drive circuit according to the first aspect is such that the power transistor is an IGBT.

According to some embodiments of the invention, by changing a current that is the reference of the constant current based on the voltage generated by the temperature detection element, it is possible to optimize the turn-on drive capability of the power transistor, and suppress noise and loss from a low temperature to a high temperature.

BRIEF DESCRIPTION OF THE DRAWINGS

FIG. 5 is a diagram showing a heretofore known power transistor drive circuit.

DETAILED DESCRIPTION

Figure 1:
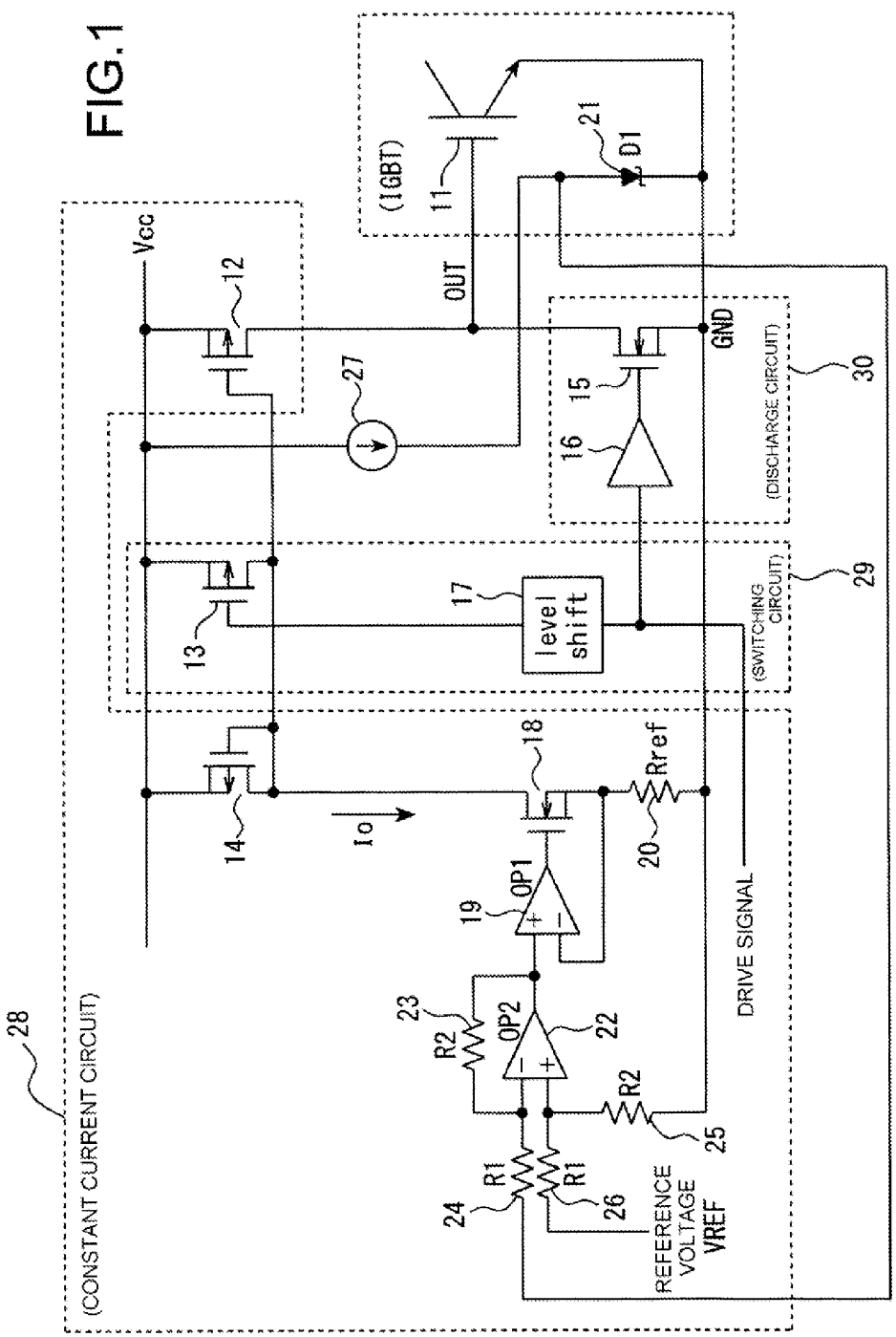
FIG. 1 is a diagram showing a configuration of a power transistor drive circuit according to a first embodiment of the invention.

Hereafter, a description will be given, referring to the drawings, of embodiments of the invention. In the following description, in each diagram referred to, portions equivalent to those in other diagrams are indicated by the same reference numerals and signs.

First Embodiment

FIG. 1 is a configuration diagram of a power transistor drive circuit according to a first embodiment of the invention. Firstly, a description will be given of a configuration of the power transistor drive circuit shown in FIG. 1. As shown in FIG. 1, the power transistor drive circuit includes a constant current circuit 28, a switching circuit 29, and a discharge circuit 30.

The constant current circuit 28 includes a P-FET 12, a P-FET 14, an N-FET 18, a resistor 20, a resistor 23, a resistor 24, a resistor 25, a resistor 26, a first operational amplifier 19, and a second operational amplifier 22. The P-FETs 12 and 14 are turned off when a high level is input into the gates thereof, and turned on when a low level is input into the gates thereof.

A power source Vcc is connected to the source of the P-FET 12. The drain of an N-FET 15 is connected to the drain of the P-FET 12. The gate and drain of the P-FET 12 are connected together. The gate of an IGBT (a power transistor) 11 is connected to the drain of the P-FET 12. The emitter of the IGBT 11 is connected to a GND.

The power source Vcc is connected to the source of the P-FET 14. The drain of the N-FET 18 is connected to the drain of the P-FET 14. One end of the resistor 20 is connected to the source of the N-FET 18. The output terminal of the first operational amplifier 19 is connected to the gate of the N-FET 18.

The gate and drain of the P-FET 14 are connected together. The gate of the P-FET 12 is connected to the gate of the P-FET 14. Consequently, the P-FET 12 and P-FET 14 configure a current mirror. The other end of the resistor 20 is connected to the GND.

One end of the resistor 24 is connected to the anode of a zener diode 21. The other end of the resistor 24, as well as being connected to the inverting input terminal (−) of the second operational amplifier 22, is connected to one end of the resistor 23. The resistor 23 is a feedback resistor of the second operational amplifier 22, and the other end of the resistor 23, as well as being connected to the output terminal of the second operational amplifier 22, is connected to the non-inverting input terminal (+) of the first operational amplifier 19.

One end of the resistor 26 is connected to the input terminal of a reference voltage Vref supplied from the exterior. The other end of the resistor 26, as well as being connected to one end of the resistor 25, is connected to the non-inverting terminal (+) of the second operational amplifier 22. The other end of the resistor 25 is connected to the GND.

The one end of the resistor 20 is connected to the inverting input terminal (−) of the first operational amplifier 19.

The switching circuit 29 includes a P-FET 13 and a level shift circuit 17. The source of the P-FET 13 is connected to the Vcc. The drain of the P-FET 13 is connected to the drain of the P-FET 14. The output side of the level shift circuit 17 is connected to the gate of the P-FET 13.

Further, a drive signal supplied from the exterior is input into the level shift circuit 17 and a buffer 16, and an output from the buffer 16 is supplied to the gate of the N-FET 15. The GND is connected to the source of the N-FET 15. The discharge circuit 30, which forcibly connects the gate of the IGBT 11 to the GND, is configured by the N-FET 15 and buffer 16.

When the IGBT 11 is in operation, a low level drive signal is supplied from the exterior. Conversely, when the IGBT 11 is not in operation, a high level drive signal is input from the exterior. The level shift circuit 17 and buffer 16 are configured in such a way as to output a low level signal when a low level drive signal is input thereinto, and output a high level signal when a high level drive signal is input thereinto.

Furthermore, the drive circuit shown in FIG. 1 includes a constant current source 27 that generates a constant current, apart from the constant current circuit 28, and the temperature detection zener diode (a temperature detection element) 21.

The input side of the constant current source 27 is connected to the power source Vcc. Further, the anode of the temperature detection zener diode 21 is connected to the output side of the constant current source 27.

Furthermore, the anode of the temperature detection zener diode 21 is connected to the one end of the resistor 24 provided in the constant current circuit 28. Further, the GND is connected to the cathode of the temperature detection zener diode 21. The temperature detection zener diode 21 is incorporated in the same semiconductor substrate as a semiconductor substrate into which the IGBT 11 is built.

Hereafter, a description will be given of an operation of the power transistor drive circuit of FIG. 1.

On a low level drive signal being input from the exterior and input into the buffer 16 when the IGBT 11 is in operation, a low level signal is output from the buffer 16, and the N-FET 15 is turned off, while a low level signal is output from the level shift circuit 17 too, and the P-FET 13 is turned on. Therefore, a high level signal is output to the gate of the IGBT 11, and the IGBT 11 is turned on. When the IGBT 11 is not in operation, outputs from the level shift circuit 17 and buffer 16 also become a high level on a high level drive signal being input. Then, the P-FET 13 is turned off, and the N-FET 15 is turned on, meaning that the gate of the IGBT 11 is connected to the GND, and electric charge of the gate of the IGBT 11 is extracted.

Further, when the IGBT 11 is in operation, a current is caused to flow from the constant current source 27 to the temperature detection zener diode 21, and a voltage VF generated between both end portions of the temperature detection zener diode 21 is input into the inverting input terminal of the operational amplifier 22 via the resistor 24. At this time, when the resistance values of the resistors 24 and 26 are taken to be R1, and the resistance values of the resistors 23 and 25 are taken to be R2, an output Vo from the operational amplifier 22 is expressed by an expression (2).

$$Vo = R2 \cdot (VREF - VF)/R1 \quad (2)$$

Furthermore, when the output Vo from the second operational amplifier 22 is input into the non-inverting input terminal of the first operational amplifier 19, Io that is the reference current of the constant current circuit 28, that is, the current Io flowing through the resistor 20 (Rref), is expressed by an expression (3).

$$Io = Vo/Rref = R2 \cdot (VREF - VF)/(R1 \cdot Rref) \quad (3)$$

Herein, R1, R2, VREF, and Rref are constants, but VF has negative temperature characteristics, meaning that the higher the temperature, the lower VF, so Io increases, in accordance with the expression (3). That is, a constant current capability to drive the IGBT 11 increases as the temperature rises.

Conversely, the lower the temperature, the higher VF, so Io decreases. That is, the constant current capability to drive the IGBT 11 decreases as the temperature lowers.

Figure 2:
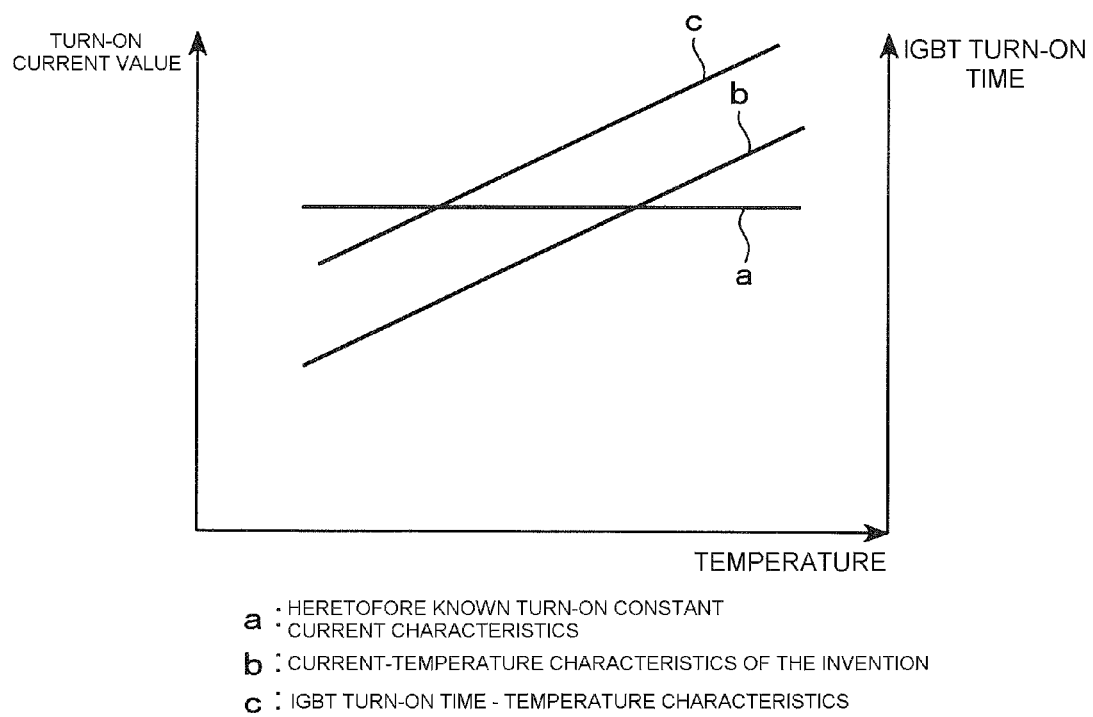
FIG. 2 is a diagram showing temperature characteristics of the power transistor drive circuit according to the first embodiment of the invention.

FIG. 2 is a diagram showing temperature characteristics of the power transistor drive circuit according to the first embodiment of the invention. In FIG. 2, a heretofore known temperature characteristic line a of the constant current capability to drive the IGBT 11 when turning on indicates that the constant current capability is constant even when the temperature changes. Because of this, as seen from an IGBT 11 turn-on time—temperature characteristic line c, when the temperature is high, there is a deficiency of the constant current capability to drive the IGBT 11, and when the temperature is low, there is an excess of the constant current capability to drive the IGBT 11.

Meanwhile, with the configuration of this embodiment, as characteristics are exhibited as represented by a line b in FIG. 2 indicating that the constant current capability varies depending on the temperature, it is possible to cause the current-temperature characteristics to coincide with or approximate to the inclination of the temperature characteristics a of the constant current capability, and thus possible to realize an optimum turn-on time at any temperature from a low temperature to a high temperature, and reduce the temperature dependence of loss and noise when turning on.

Also, by using the resistors R1 and R2 with the same temperature characteristics, it is possible to cancel out variations, and furthermore, the temperature characteristics of VREF fall within ±3% of a standard value in a range of −20° C. to 125° C.

Furthermore, by optimizing voltage variations of the temperature detection diode 21, it is possible to obtain precise characteristics of the current Io, that is, characteristics of the constant current circuit 28, with respect to the temperature, and thus possible to provide a power transistor drive circuit such that it is possible to reduce the temperature dependence of loss and noise when the IGBT 11 is turned on at any temperature from a low temperature to a high temperature.

That is, as long as the temperature characteristics of the resistors R1 and R2 are the same, the temperature characteristics of a reference voltage VREF are precise enough to fall within, for example, ±3% of the standard value in a range of, for example, −20° C. to 125° C., and the temperature characteristics of the constant current source 27 are precise enough to fall within, for example, ±10% of the standard value in a range of −20° C. to 125° C., an input into the non-inverting input terminal of the operational amplifier 22 is approximately constant even when the temperature of the constant current source 27 changes greatly to the low temperature side or high temperature side due to heat generated in, and the environment of usage of, the IGBT 11. Therefore, it is possible to fully realize the advantage according to this embodiment that it is possible to realize an optimum turn-on time at any temperature from a low temperature to a high temperature, and reduce the temperature dependence of loss and noise when turning on.

Herein, in the first embodiment, the constant current circuit 28 corresponds to a constant current generation unit, the resistor 20 corresponds to a constant current resistor, and a control circuit is configured by the operational amplifier 22 and resistors 23 to 26.

Second Embodiment

Figure 3:
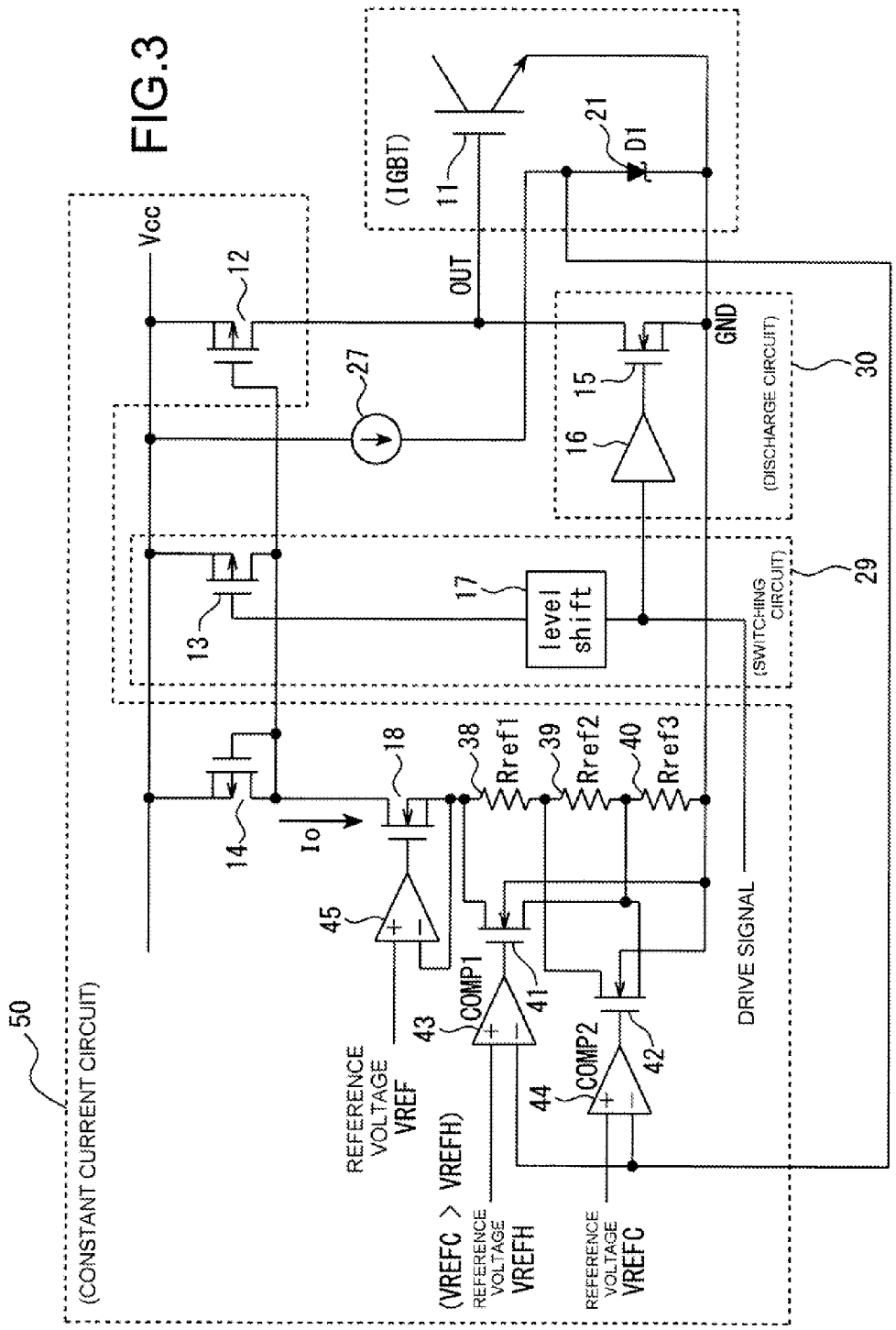
FIG. 3 is a configuration diagram of a power transistor drive circuit according to a second embodiment of the invention.

FIG. 3 is a diagram showing a power transistor drive circuit according to a second embodiment, and the same reference numerals and signs are given to components substantially the same as the components in FIG. 1. In the second embodiment, an operational amplifier 45 is used in place of the operational amplifier 19 in FIG. 1, and comparators 43 and 44 are used in place of the operational amplifier 22. Also, the resistor 20 in FIG. 1 is divided into three, a resistor 38, a resistor 39, and a resistor 40.

As shown in FIG. 3, the power transistor drive circuit of the second embodiment includes a constant current circuit 50, the switching circuit 29, and the discharge circuit 30. The constant current circuit 50 is different in configuration from the constant current circuit 28 in FIG. 1.

That is, the constant current circuit 50 of the second embodiment includes the P-FET 12, the P-FET 14, the N-FET 18, an N-FET 41, an N-FET 42, and the operational amplifier 45, and further includes the mutually series connected resistors 38, 39, and 40 with resistance values Rref1, Rref2, and Rref3 respectively. Furthermore, the constant current circuit 50 includes the comparators 43 and 44.

The reference voltage VREF is applied to the non-inverting terminal of the operational amplifier 45, the drain of the N-FET 18 is connected to the inverting terminal of the operational amplifier 45, and the output terminal of the operational amplifier 45 is connected to the gate of the N-FET 18.

A high potential side (normal-low temperature determination) reference voltage VREFH is applied to the non-inverting terminal of the comparator 43. A voltage between both end portions of the temperature detection zener diode 21 is applied to the inverting terminal of the comparator 43. The output terminal of the comparator 43 is connected to the gate of the N-FET 41. The N-FET 41 is turned on when a high level is applied to the gate of the N-FET 41, that is, when an output from the comparator 43 is of a high level.

Further, the drain of the N-FET 41 is connected to the high potential side end portion of the resistor 38, and the source of the N-FET 41 is connected to the low potential side end portion of the resistor 39. Consequently, when the N-FET 41 is turned on, the resistors 38 and 39 are bypassed, meaning that no current flows through the resistors 38 and 39.

A constant potential side (high-normal temperature determination) reference voltage VREFC is applied to the non-inverting terminal of the comparator 44. A voltage between both end portions of the temperature detection zener diode 21 is applied to the inverting terminal of the comparator 44. The output terminal of the comparator 44 is connected to the gate of the N-FET 42. The N-FET 42 is turned on when a high level is applied to the gate of the N-FET 42, that is, when an output from the comparator 44 is of a high level.

Further, the drain of the N-FET 42 is connected to the high potential side end portion of the resistor 39, and the source of the N-FET 42 is connected to the low potential side end portion of the resistor 39. Consequently, when the N-FET 42 is turned on, the resistor 39 is bypassed, meaning that no current flows through the resistor 39.

Herein, when voltages generated between both end portions of the temperature detection zener diode 21 when the temperature is low, normal, and high are taken to be VFC, VFRT, and VFH respectively, there is a relationship VFC>VFRT>VFH because the temperature detection zener diode 21 has negative temperature characteristics.

Also, it is assumed that there is the following relationship between the reference voltage VREFH of the comparator 43, the reference voltage VREFC of the comparator 44, and the voltage generated between both end portions of the temperature detection zener diode 21.

VFC>VREFC>VFRT>VREFH>VFH

Hereafter, a description will be given of operations when the temperature is low, normal, and high.

a. When the temperature is low

As VREFC<VFC and VREFH<VFC at a low temperature, outputs from the comparators 43 and 44 both become a low level, and the N-FETs 41 and 42 are both turned off.

Consequently, a reference current IoC when the temperature is low is expressed by the following expression (4).

$$IoC = VREF/(Rref1 + Rref2 + Rref3) \quad (4)$$

b. When the temperature is normal

As VREFC>VFRT and VREFH>VFRT at a normal temperature, an output from the comparator 43 becomes a low level, an output from the comparator 44 becomes a high level, the N-FET 41 is turned off, and the N-FET 22 is turned on, meaning that the resistor 39 takes on a short circuit condition.

Consequently, a reference current IoRT when the temperature is normal is expressed by the following expression (5).

$$IoRT = VREF/(Rref1 + Rref3) \quad (5)$$

c. When the temperature is high

As VREFC>VFH and VREFH>VFH at a high temperature, outputs from the comparator 43 and comparator 44 both become a high level, and the N-FET 41 and N-FET 42 are both turned on, meaning that the resistor 38 and resistor 39 take on a short circuit condition.

Consequently, a reference current IoH when the temperature is high is expressed by the following expression (6).

$$IoH = VREF/Rref3 \quad (6)$$

Figure 4:
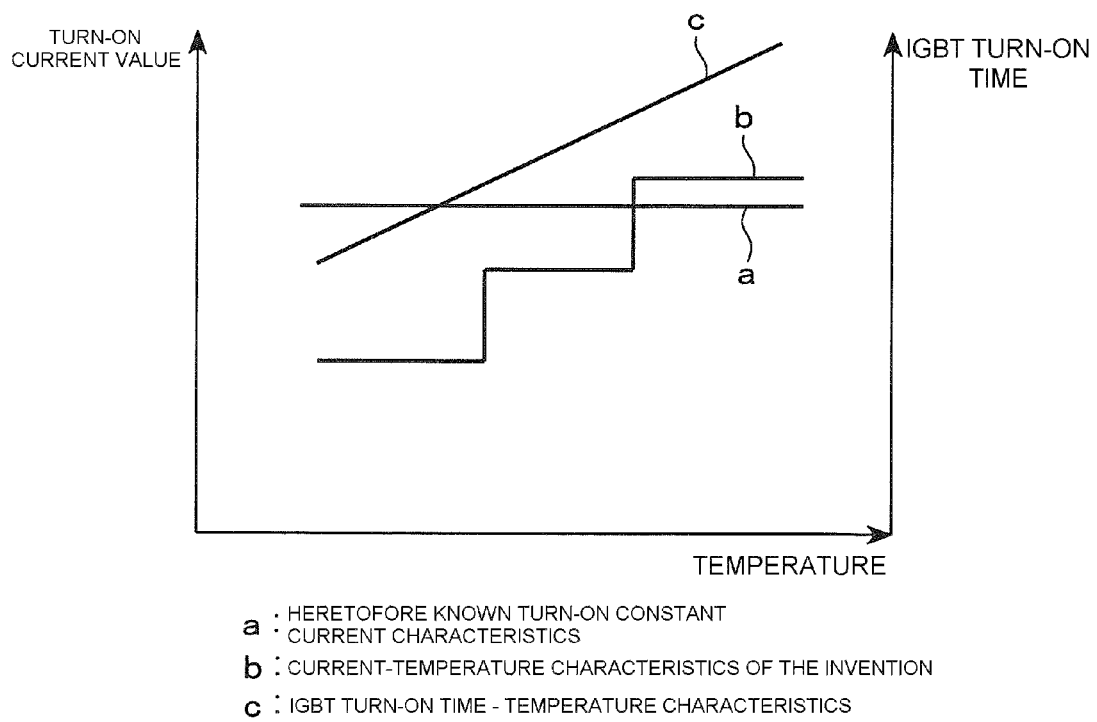
FIG. 4 is a diagram showing temperature characteristics of the power transistor drive circuit according to the second embodiment of the invention.

In this way, the reference currents establish the relationship of IoC<IoRT<IoH in accordance with the temperature as results of the expressions (4), (5), and (6) and, as shown by current characteristics b of the IGBT turn-on time, shown in FIG. 4, by causing the constant current capability to change stepwise in accordance with the temperature characteristics of the IGBT turn-on time along with a rise in temperature, and causing the current-temperature characteristics to follow an IGBT 11 turn-on time—temperature characteristic line c, it is possible to realize an optimum turn-on time at any temperature from a low temperature to a high temperature, and reduce the temperature dependence of loss and noise when turning on.

Herein, in the second embodiment, the constant current circuit 50 corresponds to a constant current generation unit, the resistors 38 to 40, as well as corresponding to first to third resistors, correspond to a constant current resistor, and a control circuit is configured by the comparators 43 and 44 and N-FETs 41 and 42.

In the heretofore described embodiments, a description is given of a case wherein the IGBT 11 is used as a power transistor, but this not being limiting, the invention can also be applied to another power transistor such as a power MOSFET.

Also, in the heretofore described embodiments, a description is given of a case wherein the temperature detection zener diode 21 with negative temperature characteristics is used as a temperature detection element, but this not being limiting, an element other than a zener diode may be used, and the invention can also be applied to an element with positive temperature characteristics.

Further, in the second embodiment, an arrangement is such as to include three resistors 38 to 40, and switch the number of resistors, of the resistors 38 to 40, connected in series in accordance with the temperature, but the number of resistors not being limited to this, the number of resistors may be two or four or more, and it is sufficient that a combination of bypassed resistors can be selected in accordance with the number of resistors, and a necessary number of comparators and reference potentials are prepared in accordance with the selected combination.

As described heretofore, according to the power transistor drive circuit according to the invention, by causing the constant current capability to change continuously or stepwise in accordance with the temperature characteristics of the IGBT turn-on time, and causing the current-temperature characteristics to follow the IGBT turn-on time—temperature characteristic line, it is possible to realize an optimum turn-on time at any temperature from a low temperature to a high temperature, and reduce the temperature dependence of loss and noise when turning on.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-089761, filed on Apr. 10, 2012. The disclosure of the priority application, in its entirety, including the drawings, claims, and the specification thereof, is incorporated herein by reference.

What is claimed is:

1. A power transistor drive circuit, comprising:
   a constant current generation unit, having a first transistor, a second transistor, a third transistor, and a constant current resistor, that supplies a current to a power transistor;
   a constant current source that generates a constant current, apart from the constant current generation unit; and
   a temperature detection element, provided integrally in a semiconductor substrate in which is provided the power transistor, that generates a voltage in accordance with temperature, based on the constant current output from the constant current source, wherein
   one end of the constant current resistor is connected to a first reference potential, while the other end is connected to the source of the first transistor,
   the drain of the first transistor is connected to the drain of the second transistor,
   the source of the second transistor is connected to a second reference potential, and
   the third transistor, of which the drain is connected to the gate, configures a current mirror with the first transistor, while the source of the third transistor is connected to the second reference potential, and the drive circuit further comprising:
   a control circuit that, based on the voltage in accordance with temperature generated by the temperature detection element, controls a current flowing through the first transistor and constant current resistor,
   wherein
   the constant current resistor is configured including a first resistor, a second resistor, and a third resistor,
   the voltage in accordance with temperature has negative temperature characteristics, and
   when ranges of the voltage in accordance with temperature corresponding to a high temperature, a normal temperature, and a low temperature are taken to be a first voltage range, a second voltage range, and a third voltage range respectively, the control circuit is such that
   when the voltage in accordance with temperature is in the first temperature range, one of the first to third resistors is connected in series between the first transistor and first reference potential,
   when the voltage in accordance with temperature is in the second temperature range, two of the first to third resistors are connected in series between the first transistor and first reference potential, and
   when the voltage in accordance with temperature is in the third temperature range, all of the first to third resistors are connected in series between the first transistor and first reference potential.

2. The power transistor drive circuit according to claim 1, wherein the temperature detection element is a diode.

3. The power transistor drive circuit according to claim 1, wherein
   the lower the temperature of the power transistor, the further the control circuit reduces the value of current flowing through the constant current resistor of the constant current generation unit.

4. The power transistor drive circuit according to claim 1, wherein
   the control circuit controls the gate voltage of the first transistor based on the voltage in accordance with temperature generated by the temperature detection element and on a reference voltage.

5. The power transistor drive circuit according to claim 1, wherein the power transistor is an IGBT.

* * * * *